(12) United States Patent
Wang et al.

(10) Patent No.: US 6,516,035 B1
(45) Date of Patent: Feb. 4, 2003

(54) INTELLIGENT ENCODING METHOD FOR WIRELESS DATA COMMUNICATION AND CONTROL

(75) Inventors: Lichen Wang, Watsonville, CA (US); Keming W. Yeh, Fremont, CA (US)

(73) Assignee: ActiSys Corporation, Fremont, CA (US)

( * ) Notice: Subject to any disclaimer, the term of this patent is extended or adjusted under 35 U.S.C. 154(b) by 0 days.

(21) Appl. No.: 09/545,229

(22) Filed: Apr. 7, 2000

(51) Int. Cl.[7] .................... H04B 14/04; H03M 7/00
(52) U.S. Cl. .................. 375/253; 370/449; 341/60
(58) Field of Search ................ 375/242, 246, 375/253; 370/445, 447, 449, 461, 462; 340/825.5; 341/59, 60, 67; 382/245

(56) References Cited

U.S. PATENT DOCUMENTS

| | | | | |
|---|---|---|---|---|
| 4,742,512 A | * | 5/1988 | Akashi et al. | 370/347 |
| 5,475,388 A | * | 12/1995 | Gormish et al. | 341/107 |
| 5,574,567 A | * | 11/1996 | Cookson et al. | 386/46 |
| 5,687,175 A | * | 11/1997 | Rochester, Jr. et al. | 370/449 |
| 5,838,774 A | * | 11/1998 | Weisser, Jr. | 379/92.02 |
| 5,912,636 A | * | 6/1999 | Gormish et al. | 341/50 |
| 6,219,457 B1 | * | 4/2001 | Potu | 382/246 |
| 6,236,341 B1 | * | 5/2001 | Dorward et al. | 341/60 |

* cited by examiner

*Primary Examiner*—Young T. Tse
(74) *Attorney, Agent, or Firm*—MacPherson Kwok Chen & Heid LLP

(57) ABSTRACT

A method includes a data encoding scheme that has a run length limit of (1,6) and a 25% duty cycle. With error correction, the method achieves an effective run length limit of (2,9). The method can be used in conjunction with a packetized communication protocol to allow multiple controllers to communicate with multiple peripheral devices in a wireless data network. Peripheral devices include pointing devices, keyboards and game pads.

14 Claims, 5 Drawing Sheets

FIG. 3 IR - TRANSMITTER

FIG. 4 IR-RECEIVER

INTELLIGENT ENCODING METHOD FOR WIRELESS DATA COMMUNICATION AND CONTROL

BACKGROUND OF THE INVENTION

1. Field of the Invention

The present invention relates to wireless communication. In particular, the present invention relates to wireless communication used in data network and remote control applications.

2. Discussion of the Related Art

Infrared radiation is widely used in data communication and remote control applications. In the prior art, data in infrared communication have been encoded, in sophisticated applications, by modulating amplitude, frequency or both. In simpler applications, data can be encoded simply by the presence or absence of infrared radiation at expected times.

One class of encoding methods is characterized by encoding every N bits of data into a symbol consisting of M binary bits of code (i.e., each bit is represented by the logic value '1' or '0'), and transmitting these M bits in M time slots sequentially. In some implementations, each bit of code can be represented within a time slot by the presence or absence of a single pulse of infrared radiation (the "single pulse" approach), or the presence or absence of a sequence of equally spaced pulses of infrared radiation (the "multiple pulses" approach). (Under the multiple pulses approach, the frequency of pulse repetition is known as the sub-carrier frequency.) In either approach, whether the presence or absence of radiation represents logic '1' value or logic '0' value is a matter of convention. For convenience, in the remainder of the present discussion, logic '0' and '1' values are represented, respectively, by the absence and presence of radiation in the designated time slot. The present invention is, however, not limited to either approaches. The single pulse approach is naturally simpler and faster. However, the multiple pulses approach provides a greater range due to a higher signal-to-noise ratio achievable under that approach.

Typically, the number M of bits in each symbol is usually greater than the number N of data bits. This arrangement provides a number of benefits, including (a) allowing better synchronization of clocks on the transmitting and receiving sides, (b) simplifying the design of the transmitter and the receiver, and (c) providing error detection or error correction capabilities.

Several figures of merit have been used to compare encoding schemes. For example, "Code rate" is the ratio N/M. Another example is "run length limits", which is typically expressed as (d,k), where d and k are, respectively, the minimum and maximum lengths allowed for a run of logic '0' value between two logic '1' values in each symbol of the encoding scheme, or between successively transmitted symbols. Yet another example is "Duty cycle", which is typically expressed as a product of two factors a and b, where a is the percentage of logic 1 bits out of the total number of bits used in the symbols of the encoding scheme, and b is the percentage of time in a time slot during which radiation representing the data is present.

One encoding scheme in the prior art is the "FIR" or "4PPM" scheme. FIR has a code rate of 2/4 and a run length limit of (0,6). FIR uses the single pulse approach, with the single pulse or logic '1' value using the entire time slot, thus providing a 25%×100% duty cycle. The following is the code dictionary under FIR:

| (Data) | {Symbol} |
|---|---|
| (00) | {1000} |
| (01) | {0100} |
| (10) | {0010} |
| (11) | {0001} |

Under FIR, the minimum separation between logic '1' values is zero, which occurs whenever the symbol {0001} is followed by the symbol {1000}. In that instance, the two adjacent logic '1' values form a single pulse of double width. However, such a pulse can be erroneously processed at the receiver and the decoder circuit, as it is often difficult to differentiate a single-width pulse from the occasional double-width pulse due to distortion in the communication channel.

Another encoding scheme is the "MIR" scheme. MIR, which also takes the single pulse approach (with the single pulse occupying one quarter of the time slot), has a code rate of 1/1+ (explained below), a run length limit of (0,5), and a high variable duty cycle of 50%×25% maximum. The code dictionary for MIR is as follows:

| (Data) | {Symbol} |
|---|---|
| (0) | {1} |
| (1) | {0} |

MIR requires that a logic '1' value be inserted after a run of five consecutive logic '0' values. This additional rule provides the variability in the code rate and the duty cycle. The extra logic '1' values are removed by the receiver prior to decoding. As in FIR, the zero value in the run length limit can create error in the receiver. Such errors are reduced by using a single pulse which occupies only one quarter of the time slot, at the expense of bandwidth.

Yet another example is the "SIR" or "HP SIR" coding scheme, which has a code rate of 8/10, a run length limit of (0,9). SIR also uses a single pulse approach, with a pulse width up to 3/16 of a time slot, to provide a maximum variable duty cycle of 90%×19%. The code dictionary for SIR is as follows:

| (Data) | {Symbol} |
|---|---|
| (xxxxxxxx) | {1yyyyyyy0} | where y is the logic value complement of x (i.e., if x has logic '0' value, then y is logic '1' value). In SIR, a logic '1' value is inserted before each 8 bits, and a logic '0' value is always inserted after the 8 bits. SIR also suffers from zero minimum run length limit and a high variable duty cycle, as in MIR and FIR discussed above.

A fourth exemplary encoding scheme is the "DASK" scheme in certain implementations by Sharp Corporation. DASK provides a code rate of 8/10, a run length limit of (0,9). DASK uses a sub-carrier frequency of 500 KHz and a high variable maximum duty cycle of 90%×50%. The code dictionary for DASK is as follows:

| (Data)      | {Symbol}      |
|-------------|---------------|
| (xxxxxxxx)  | {1yyyyyyyy0}  | where y is the logic complement of x. DASK suffers the same disadvantage as SIR discussed above.

A fifth exemplary encoding scheme is the "IrBUS" or "16PSM" encoding scheme, which provides a code rate of 4/8, a run length limit of (0,10) and a subcarrrier of 1.5 MHz, and providing a high variable maximum duty cycle of 50%×50%. The code dictionary for IrBus is as follows:

| (Data)  | {Symbol}    |
|---------|-------------|
| (0000)  | {10100000}  |
| (0001)  | {01010000}  |
| (0010)  | {00101000}  |
| (0011)  | {00010100}  |
| (0100)  | {00001010}  |
| (0101)  | {00000101}  |
| (0110)  | {10000010}  |
| (0111)  | {01000001}  |
| (1000)  | {11110000}  |
| (1001)  | {01111000}  |
| (1010)  | {00111100}  |
| (1011)  | {00011110}  |
| (1100)  | {00001111}  |
| (1101)  | {10000111}  |
| (1110)  | {11000011}  |
| (1111)  | {11100001}  |

IrBus is designed to avoid interference with the 38 KHz sub-carrier used by other equipment. However, IrBus also suffers from the zero minimum run length limit, and the variable duty cycle with a 50% maximum in the first factor.

A sixth exemplary encoding method is "RC-5" or "Bi-phase", which has a code rate of ½, a run length limit of (0,2), a sub-carrier of 36 KHz, and a fixed duty cycle of 50%×50%. The code dictionary for RC-5 is as follows:

| (Data) | {Symbol} |
|--------|----------|
| (0)    | {01}     |
| (1)    | {10}     |

RC-5 also suffers from the zero minimum run length limit and a high duty cycle.

Other encoding methods have data-dependent transmission time, or use complex algorithms, such that they are either unsuitable or uneconomical for many applications. For example, a proposed "IrDA VFIR" or "HHH(1,13)" method has a high code rate of ⅔, a run length limit of (1,13). IrDA VFIR uses a single pulse approach with a pulse width occupying the full time slot, to provide a variable maximum duty cycle of 33%×100%. Under IrDA VFIR, a linear feedback shift register first scrambles the data bits, and then encodes every 2 bits of the scrambled data into three consecutive time slots. The IrDA VFIR uses a symbol dictionary which includes the symbols: {000}, {001}, {010}, {100}, and {101}. A state machine which next state is based on the current two bits of scrambled data controls the next symbol assignment for the next two bits to be transmitted, so that the resulting code has a run length limit of (1,13). As a result, the first factor in the duty cycle is variable with a maximum of 33%. As IrDA takes a single pulse approach, with the single pulse occupying the entire time slot, the second factor in the duty cycle is 100%.

SUMMARY OF THE INVENTION

The present invention provides a method for encoding a bit stream into symbols for transmitting over a wireless communciation link that has a fixed duty cycle and a run length limit (d, k), in which d is greater than 0. With error correction capability included in the decoding process, the resulting effective run length limit can be further increased. The present invention is suitable for use in infrared application and RF application, even at low bit rates.

In one embodiment of the present invention, an encoding schme is provided which includes a state machine having a first state, a second state and a third state, each state being associated with a different group of symbols. In each group of symbols are state transition symbols. The encoding scheme uses this state machine to guide encoding data bits. When a state transition symbol is generated, the state machine also changes state. In one implementation, 4-bit symbols are used, with each symbol in the first group of symbols provided a ratio of logic '1' bits to logic '0' value bits equaling 3 to 1, and each symbol in the third group of symbols having a ratio of 2:2 and one symbol in the second group being {0000}. In that implementation, the state machine goes into the second state to avoid the current symbol from being followed by another symbol in the first group to create consecutive logic '1' value bits. Also, in that implementation, the state machine, after issuing the {0000} symbol, enters the third state, so as to allow the higher duty cycle symbols in the third group to maintain an overall average duty cycle of 25%.

In that implementation, the code dictionary includes error correction capability to extend said run length limit to an effective run length limit of (2,9).

The encoding scheme of the present invention can be used in a wireless communication system. In one such system, a controller capable of sending a polling packet having an identification field is provided, so that multiple devices, each identified by a unique identification specified in the polling packet can respond by sending a response packet returning device-specific information (e.g., position of a pointing device, key depressed on a key board, etc.)

The present invention is better understood upon consideration of the detailed description below and the accompanying drawings.

DETAILED DESCRIPTION OF THE PREFERRED EMBODIMENTS

In one embodiment of the present invention, an encoding method provides a code rate of ⅔, a nominal run length limit of (1,6), but an effective run length limit of (2,9). In that embodiment, the method can be implemented under either a single pulse approach or a multiple pulses approach (i.e., using a sub-carrier frequency). A fixed duty cycle of 25%× 100% or 25%×50% can be achieved. A method of the present invention can also provide error-detection or error-correction capabilities.

In this embodiment, data are encoded 2 bits at a time into 4-bit symbols, using a state machine having three states labeled respectively {00, 01, 10}. The encoding scheme is tabulated below and illustrated in FIG. 1 by state machine 100:

| [State] | (Data) | {Symbol} | [Next State] |
|---|---|---|---|
| [00] | (00) | {0001} | [01] |
| [00] | (01) | {0010} | [00] |
| [00] | (10) | {0100} | [00] |
| [00] | (11) | {1000} | [00] |
| [01] | (00) | {0001} | [01] |
| [01] | (01) | {0010} | [00] |
| [01] | (10) | {0100} | [00] |
| [01] | (11) | {0000} | [10] |
| [10] | (00) | {0101} | [01] |
| [10] | (01) | {1010} | [01] |
| [10] | (10) | {0100} | [10] |
| [10] | (11) | {1001} | [01] |

Figure 1:
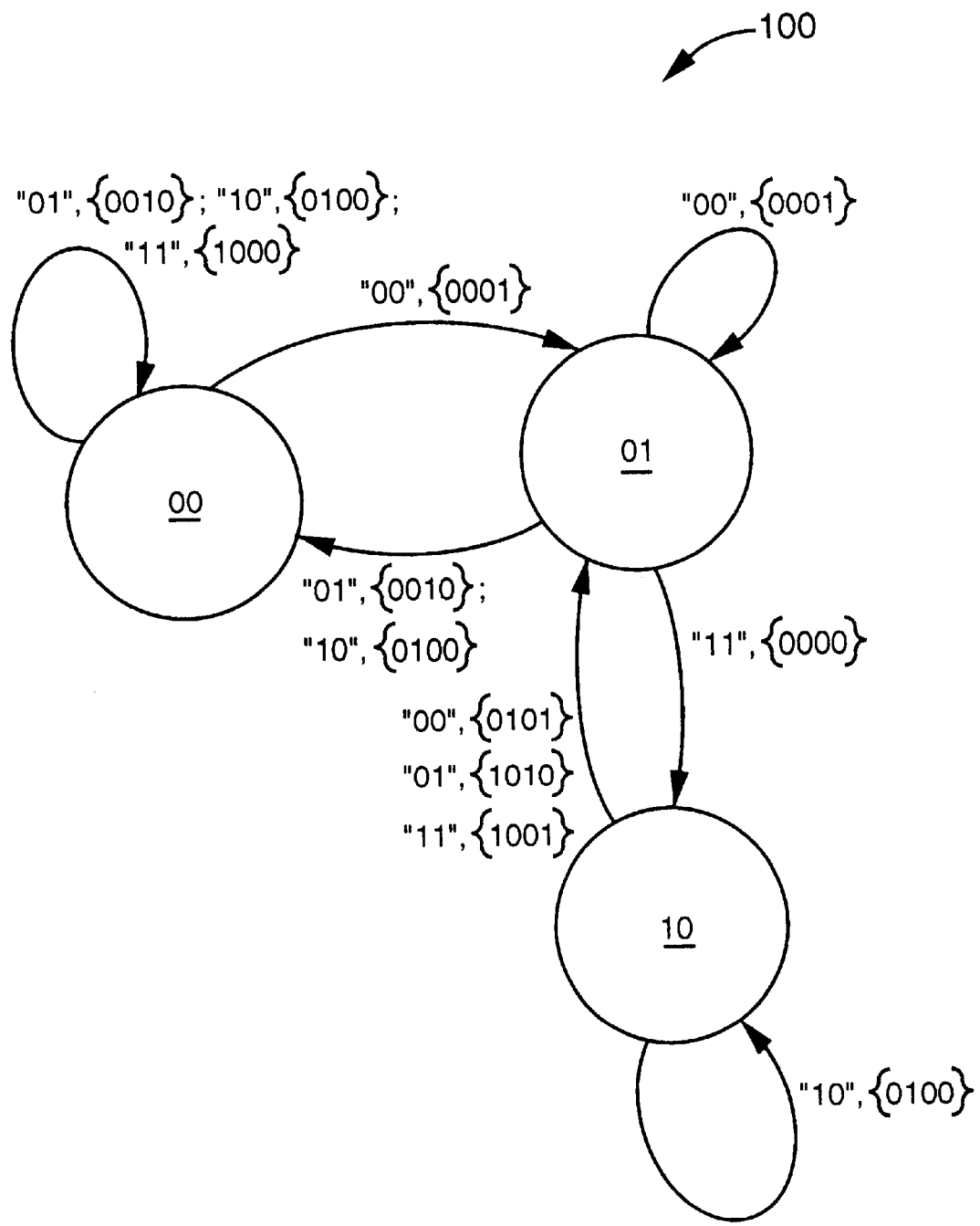
FIG. 1 shows state machine 100, which illustrates an encoding scheme in one embodiment of the present invention.

The present encoding scheme is designed to achieve a run length limit of (1,6) and a first factor of the duty cycle to be 25%. But due to the Hamming distance in the code and an error correction technique used, the effective run length limit is (2,9), as explained below. As shown in FIG. 1, state machine 100 is initially at state 00. In state 00, when 2-bit data "00", "01", "10", "11" are encoded respectively by symbols {0001}, {0010}, {0100} and {1000}. (The assignment of data bits to the corresponding symbol is arbitrary). State machine 100 stays in state 00, except after providing the symbol {0001}, when state machine enters state 01, to avoid a double-width pulse if the next two bits to be encoded are "11". (A double-width pulse would violate the minimum run length limit of (1, 6)). In state 01, 2-bit data "01" and "10" are encoded by symbols {0010} and {0100} respectively. Since these symbols have a logic '0' value in the last bit, state machine can return to state 00. State machine 100 encodes bits"00" by symbol {001} and stays in state 01, owing to the potential double-width '1' hazard. Note that symbol {1000} is not available in state 01, since symbol {1000} would cause a double-width '1' hazard. Thus, in state 01, state machine 100 encodes "11" by symbol {0000}. However, the symbol {0000}does not achieve a duty cycle first factor of 25%. Thus, upon providing symbol {0000}, state machine 100 enters state 10. In state 10, state machine 100 encodes data bits "00", "01", and "11" by symbols {0101}, {1010} and {1001}, respectively, so as to return the duty cycle first factor to 25%. Upon providing any of the symbols {0101}, {1010} and {1001}, state machine 100 returns to state 01. Since symbols with two consecutive logic '1' values are not allowed, state machine encodes bits "10" by symbol {0100} and defers returning to state 01.

The present embodiment of the present invention can be implemented either by a single pulse approach or a multiple pulses approach. Under a single pulse approach, a duty cycle of 25%×100% is achieved. Under a multiple pulse approach, a duty cycle of 25%×50% is achieved. The decoding scheme is tabulated below, and illustrated by state machine 200 of FIG. 2:

| [State] | {Symbol} | (Data) | [Next State] |
|---|---|---|---|
| [00] | {0000} | (00) | [11] |
| [00] | {0001} | (00) | [01] |
| [00] | {0010} | (01) | [00] |
| [00] | {0011} | (01) | [00] |
| [00] | {0100} | (10) | [00] |
| [00] | {0101} | (00) | [11] |
| [00] | {0110} | (10) | [00] |
| [00] | {0111} | (00) | [11] |
| [00] | {1000} | (11) | [00] |
| [00] | {1001} | (00) | [11] |
| [00] | {1010} | (00) | [11] |
| [00] | {1011} | (00) | [11] |
| [00] | {1100} | (11) | [00] |
| [00] | {1101} | (00) | [11] |
| [00] | {1110} | (00) | [11] |
| [00] | {1111} | (00) | [11] |
| [01] | {0000} | (11) | [10] |
| [01] | {0001} | (00) | [01] |
| [01] | {0010} | (01) | [00] |
| [01] | {0011} | (01) | [00] |
| [01] | {0100} | (10) | [00] |
| [01] | {0101} | (00) | [11] |
| [01] | {0110} | (10) | [00] |
| [01] | {0111} | (00) | [11] |
| [01] | {1000} | (11) | [10] |
| [01] | {1001} | (00) | [01] |
| [01] | {1010} | (01) | [00] |
| [01] | {1011} | (01) | [00] |
| [01] | {1100} | (10) | [00] |
| [01] | {1101} | (00) | [11] |
| [01] | {1110} | (10) | [00] |
| [01] | {1111} | (00) | [11] |
| [10] | {0000} | (00) | [11] |
| [10] | {0001} | (00) | [11] |
| [10] | {0010} | (00) | [11] |
| [10] | {0011} | (00) | [11] |
| [10] | {0100} | (10) | [10] |
| [10] | {0101} | (00) | [01] |
| [10] | {0110} | (10) | [10] |
| [10] | {0111} | (00) | [01] |
| [10] | {1000} | (00) | [11] |
| [10] | {1001} | (11) | [01] |
| [10] | {1010} | (01) | [01] |
| [10] | {1011} | (01) | [01] |
| [10] | {1100} | (00) | [11] |
| [10] | {1101} | (11) | [01] |
| [10] | {1110} | (01) | [01] |
| [10] | {1111} | (01) | [01] |
| [10] | {????} | (11) | [11] |

Figure 2:
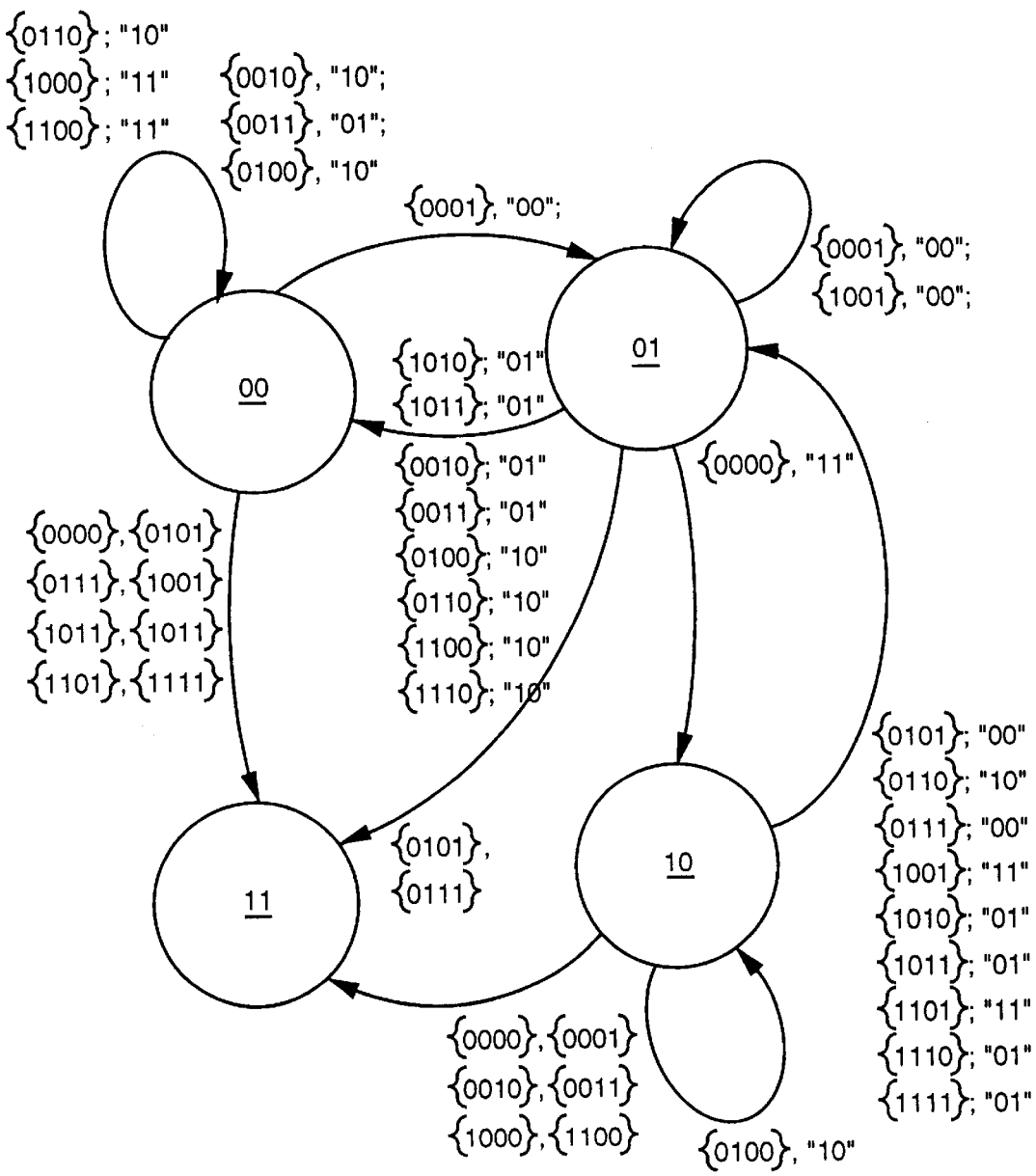
FIG. 2 shows state machine 200, which illustrates decoding of 4-bit symbols encoded under the encoding scheme of FIG. 1.

Under ideal conditions, decoding is the reverse of the encoding process. Thus, as shown in FIG. 2, starting from initial state 00, state machine 200 remains at state 00, when symbol {0010}, {0100} or {1000} is received, outputting the corresponding data bits "01", "10" or "11". State machine 200 goes to state 01, when symbol {0001} is received, outputting data bits "00". Similarly, at state 01, state machine 200 (a) stays at state 01, when symbol {0001} is received, outputting data bits "00"; (b) returns to state 00, when symbol {0010} or {0100}, outputting corresponding data bits "01" or "10"; and (c) goes to state 19 when symbol {0000} is received, outputting corresponding data bits "11". At state 10, state machine 200 (a) remains at state 10, when symbol {0100} is received, outputting corresponding data bits "10"; and (b) returns to state 01, when symbol {{0101}, {1010} or {1001} is received, outputting corresponding data bits "00", "01" or "11".

In this embodiment, when a symbol that is unexpected in the current state is received (e.g., symbol {0011} at state 00), rather than reporting an error and suspend decoding, an error correction is attempted by the decoder providing the data bits of the closest symbol. (For example, in the case of symbol {0011} in state 00, data bits "01"—corresponding also to symbol (0010}—is output.)

In infrared transmission, a logic '1' value is often distorted in the communication channel and encroaches into the adjacent time slots, so that, for example, a sequence {0100} may be received as {0110}. Thus, in state 00, symbols received as {0011}, {0110} and {1100} are decoded as data bits "01", "10" and "11", respectively. Similarly, in state 01, symbols {1001}, {1011}, {0011}, {0110}, {1100} and {1110} are decoded as data bits "00", "01", "01", "10", "10" and "10", respectively. In state 10, symbols {0110}, {0111}, {1011}, {1101}, {1110} and {1111} are decoded as "10", "00", "01", "11", "01" and "01", respectively. All other symbols are not recovered in this embodiment. When a unrecoverable symbol is received, state machine 200 goes to error state 11.

In the type of channel distortion discussed above, the sequence 1010101010101010 . . . may be erroneously received as 1111111111111111 . . . instead, in the worst case. If the run of logic '1' values is too long, the receiver may lose synchronization. A higher minimum run length limit (e.g., (d,k)=(2,k)) may be necessary to avoid losing synchronization. From the clock recovery point of view, the worst case in the present embodiment occurs in the sequence 010101000001, which may be distorted to be received as 011111100001. Even then, the clock can still be recovered in 9 time slots. Thus, the code in this embodiment of the present invention has an effective run length limit of (2,9).

Figure 3:
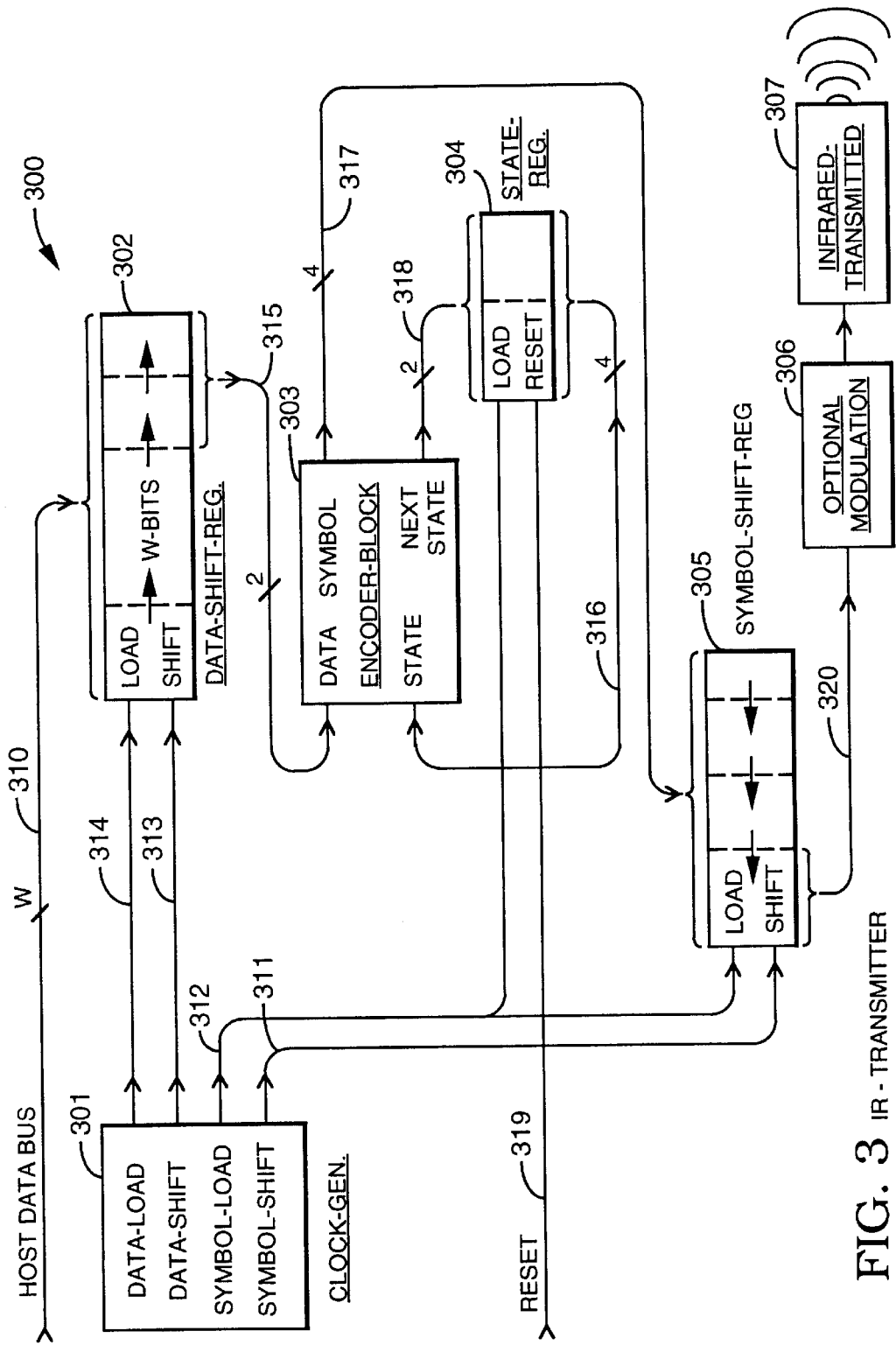
FIG. 3 shows transmitter 300 suitable for wireless data communication using the encoding scheme of state machine 100 of FIG. 1.

FIG. 3 shows a transmitter 300 suitable for wireless data communication using the encoding scheme discussed above. As shown in FIG. 3, transmitter 300 includes clock-generator 301, data Shift-register 302, encoder circuit 303, state- register 304, symbol shift-register 305, sub-carrier modulator 306, and infrared transmitter 307.

In this embodiment, clock generator 301 provides (a) at terminal 311, a symbol shift clock signal; (b) at terminal 312, a symbol load clock signal; (c) at terminal 313, a data shift clock signal; and (d) at terminal 314, a data load clock signal. The symbol shift clock signal at terminal 311 clocks symbol shift-register 305 and defines the duration of the time slot for transmitting one bit of a 4-bit symbol. The symbol load clock signal at terminal 312, which is used to load a 4-bit symbol into symbol shift-register 305, has a frequency equal to ¼ the frequency of the symbol shift clock signal at terminal 311. The data shift clock signal at terminal 313, which is used to shift 2 bits of data onto 2-bit bus 315, has a frequency twice that of the symbol load clock at terminal 312. (2 new bits are shifted onto 2-bit bus 315 every two clock periods of the data shift clock signal at terminal 313). The data load clock at terminal 314, which is used to load a w-bit data word from w-bit bus 310 into data shift register 302, has a frequency equal to 1/w that of the data shift clock signal at terminal 313.

During operation, w bits of data are latched into data shift-register 302 every period of the data load clock signal at terminal 314. Every two clock periods of the data shift clock signal at terminal 313, a 2-bit value is fed into encoder circuit 303 in parallel. Encoder circuit 303 and state register 304 implement state machine 100 of FIG. 1. A reset signal at terminal 319 initializes the current state in state register 304 to 00. Based on the 2 data bits on 2-bit bus 315 and the current state at 2-bit state bus 316 provided by state register 304, encoder circuit 313 provides a 4-bit symbol at 4-bit symbol bus 317 and a 2-bit new state on 2-bit new state bus 316.

The 4-bit symbol on symbol bus 317 and the new state on new state bus 316 are latched into symbol shift-register 305 and state register 304, respectively, each clock period of the symbol load clock signal at terminal 312. Symbol shift-register 305 is a 4-bit wide shift register, which loads the 4-bit symbol symbol on symbol bus 317 in parallel and outputs at terminal 318, at each clock period of the symbol shift clock signal (terminal 311), one bit of the latched symbol.

Each bit of the symbol shifted onto terminal 318 is transmitted serially by infrared transmitter 307. Modulator 306, which is present only under the multiple pulses approach, provides a sequence of pulses at the specified sub-carrier frequency. A suitable sub-carrier frequency is 56 KHz, because inexpensive receivers for this frequency are readily available. In one implementation, 8 cycles of this sub-carrier are used to represent a code bit 1, to result in a code rate of ⅝, or 7 Kbps and the decoded data rate is ½, or 3.5 Kbps.

Figure 4:
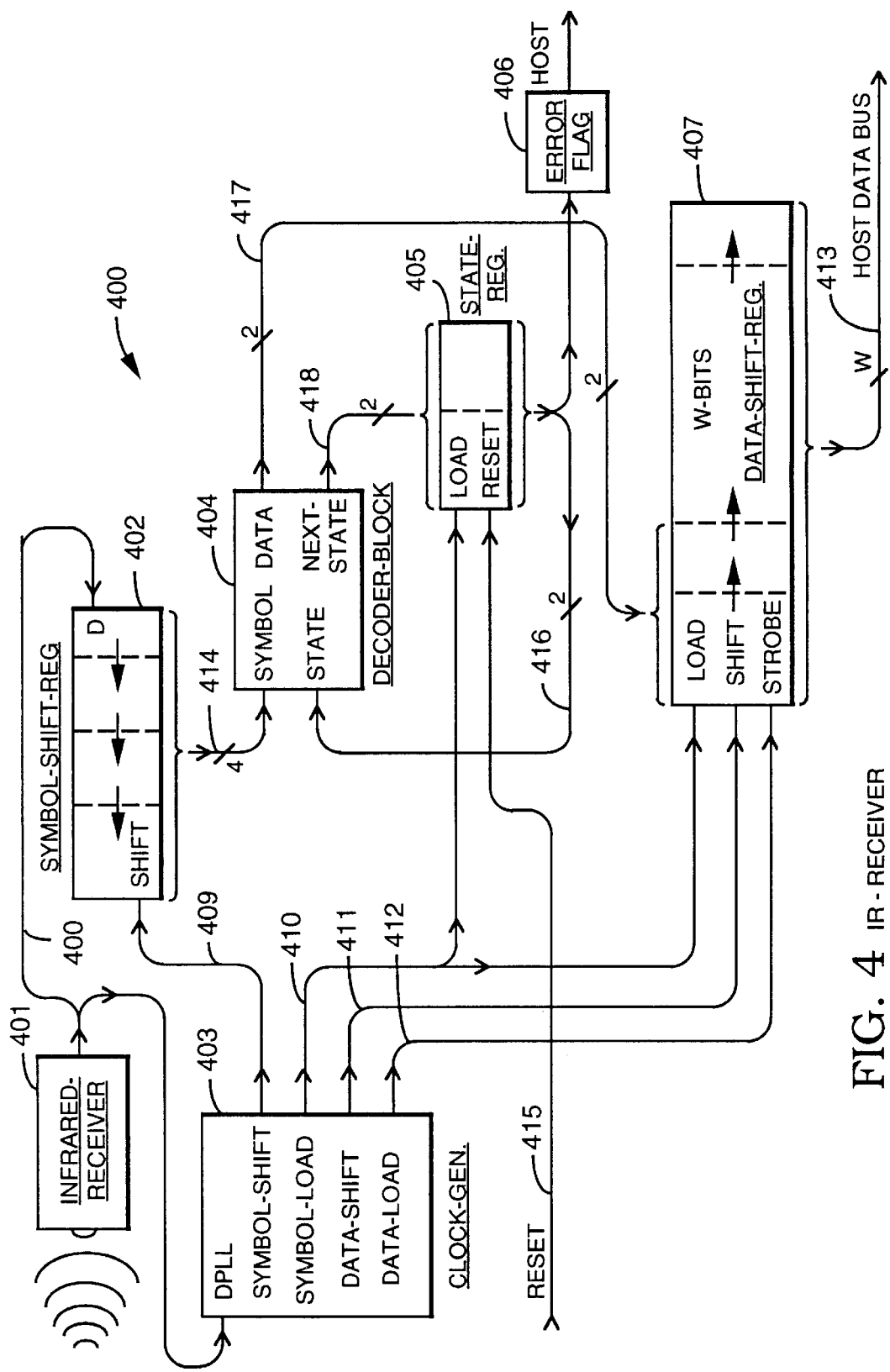
FIG. 4 shows receiver 400 suitable for wireless data communication using the decoding scheme of state machine 200 of FIG. 2.

FIG. 4 shows receiver 400 suitable for wireless data communication using the decoding scheme of state machine 200 of FIG. 2. As shown in FIG. 2, receiver 400 includes infrared receiver 401, clock generator 403, symbol shift-register 402, decoder circuit 404, state register 405, error flag register 406, and data shift-register 407.

In one embodiment of the present invention, infrared receiver 401 can be provided by an inverse biased infrared PIN diode, which signal is pre-amplified, amplified, filtered and quantized to provide the transmitted digital signal at terminal 408. If the multiple pulses approach is used, a narrow band-pass filter centered at the sub-carrier frequency and an envelope detector are also provided.

Clock generator 403 provides (a) at terminal 409 symbol shift clock signal, (b) at terminal 410, a data load clock signal, (c) at terminal 411, a data shift clock signal, and (d) at terminal 412, a data strobe clock signal. The symbol shift clock signal at terminal 409 is synchronized with the leading edge of the digital signal at terminal 408 from infrared receiver 401. This synchronization is achieved by a digital phase lock loop (DPLL) in clock generator 403. The symbol shift clock signal at terminal 409, which is used to clock symbol shift-register 402, defines the duration of a time slot for each bit of the received symbol. The symbol load clock signal at terminal 410, which loads both a new state into state register 405 and two bits of data into data shift- register 407, has a frequency equal to ¼ that of the symbol shift clock signal at terminal 409. The data Shift clock signal at terminal 411, which is used to shift one bit in data shift register 407, has twice the frequency of the symbol load clock signal at terminal 410. The data strobe clock signal at terminal 412, which is used to strobe a w-bit content of data shift register 407 onto w-bit bus 413, has a frequency equal to 1/w that of the data shift clock signal at terminal 411.

Symbol shift-register is a 4-bit shift register which holds a 4-bit symbol shifted one bit at a time into the register. The 4-bit symbol thus received is provided at 4-bit symbol bus 414 to decoder circuit 404. Decoder circuit 404 and state register 405 implement state machine 200 of FIG. 2. A reset signal at terminal 415 initializes the current state in state register 405 into state 00. Based on the current state provided by state register 405 at 2-bit current state bus 416 and the symbol provided on 4-bit symbol bus 414, decoder circuit 404 provides two bits of data on 2-bit bus 417. The two data bits are latched into data shift-register 407 according to the data shift clock signal at terminal 411. Every w bits shifted into data shift register 407, the data shift strobe signal at terminal 412 provides an 8-bit data output at w-bit bus 413.

Error flag register 406 includes a logic circuit for detecting the error state of state machine 200. In this embodiment, the 2 bits of the current state are ANDed together to produce an error flag.

During operation, every 4 clock periods of the symbol shift clock signal at terminal 409, symbol shift-register 402 outputs onto 4-bit bus 414 a 4-bit symbol received at infrared receiver 401. Initially, a reset signal at terminal 415 sets the current state in state register 405 to 00. Based on the current state at 2-bit bus 416 and the 4-bit symbol received at 4-bit bus 414, two data bits and a 2-bit next state are output on 2-bit data bus 417 and a 2-bit state bus 418. The 2-bit next state on state bus 418 and the two data bits at 2-bit data bus 417 are latched into state register 405 and data shift-register 407 respectively. Every w/2 clock periods of the data shift clock signal at terminal 411, data strobe clock signal at terminal 412 is activated to provide a w-bit output datum on w-bit data bus 413.

At low bit rates, rather than using transmitter 300 and receiver 400 of FIGS. 3 and 4, the encoding and decoding schemes discussed above can both be carried out inexpensively by software using a standard off-the-shelf microcontroller.

Transceivers (i.e., the combination of a transmitter and a receiver) based on the receiver and transmitter of the present invention (e.g., receiver 400 and transmitter 300) can be provided in peripheral devices such as keyboard, pointing devices (e.g., mice), game pads, credit card readers or smart card readers, portable digital assistants (PDAs) or PDA adapters. Such transceivers can also be provided to controller devices, such as personal computers (PCs), set-top boxes (e.g., "web-TV"s), game consoles. In the following, the encoding scheme described above is referred to as the "Extended IR" (XIR) standard, and the peripherals and controller devices are referred to as "XIR peripherals" and "XIR hosts" respectively.

Figure 5:
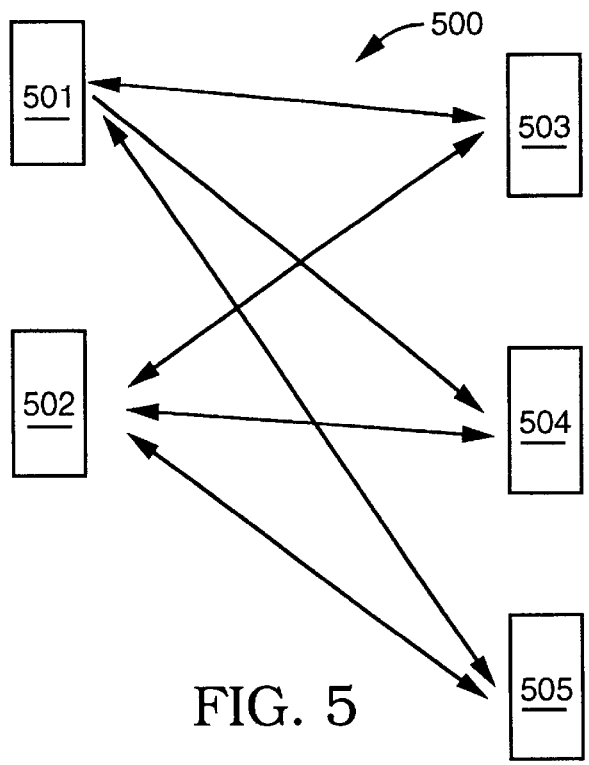
FIG. 5 illustrates, in one embodiment of the present invention, system 500 comprising XIR hosts 501 and 502 and XIR peripherals 503–505.

A software protocol used in conjunction with the communication methods described above can be used to allow communication between multiple XIR hosts and multiple XIR peripherals in the same room without interfering each other. FIG. 5 illustrates, in one embodiment of the present invention, system 500 comprising XIR hosts 501 and 502 and XIR peripherals 503–505. In one embodiment, communication between XIR hosts and XIR peripherals are packetized. Each packet includes a 2-bit start header transmitted by a start symbol {1100}, followed by a 4-bit control or ID field, which is transmitted by 2 symbols. The content and length of the remainder of the packet varies, depending upon the sender.

Figure 6A:
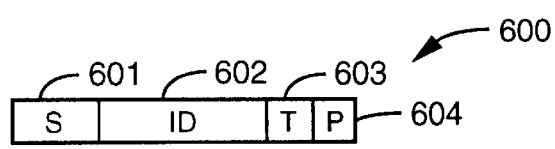
FIG. 6a shows format 600 of a polling command packet.

In system 500 of FIG. 5, XIR hosts send "polling commands" to specified XIR peripherals. FIG. 6a shows format 600 of a polling command packet. As shown in FIG. 6a, polling command packet 600 includes 2-bit start header 601, 4-bit ID field 602, toggle bit 603 and parity bit 604. Thus, polling command packet 600 is 8-bit in length and requires 4 symbols to send. ID field 602 specifies an XIR peripheral to which polling command packet 600 is directed. In one implementation, ID field 602 can take any value between 0x1 and 0xE, thus allowing one of 14 devices to be polled. Values 0x0 and 0xF are reserved for other kinds of commands, some of which are discussed below.

An XIR host uses toggle bit 603 to acknowledge receipt of a previous polling response by sending in the next polling command packet the complement of the toggle bit in the previous polling response. Parity bit 604 provides error checking. In one implementation, parity bit 604 takes a logic value such that the total number of 1's in the polling command packet is an even number.

The identification of each XIR Peripheral can be manually set up. Each XIR Host has an internal table that tabulates the ID, the type and other properties of all XIR Peripherals under its control. This internal table can also be manually set up. Alternatively, a procedure can be provided to automatically and dynamically set the ID of each XIR Peripheral and internal table of each XIR Host, using a predetermined device hierarchy and polling command packets and polling response packets identified by the reserved values of 0x0 or 0xF in the ID field.

Upon receiving a polling command packet directed to it, and after ascertaining that the polling command packet is uncorrupt by checking the parity bit of the polling command packet received against a parity bit computed for the polling command packet, an active XIR peripheral responds within a pre-determined time period. In all polling response packet, in addition to providing the start header and the ID field, the XIR peripheral also copies the toggle bit from the polling command packet received.

Figure 6B:
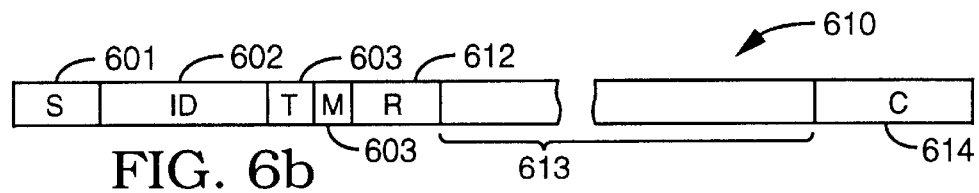
FIG. 6b shows format 610 of a polling response packet from a keyboard.

FIG. 6b shows format 610 of a polling response packet from a keyboard. As shown in FIG. 6b, polling response packet 610 includes 2-bit start header 601, 4-bit ID field 602, toggle bit 603, "Make or Break" bit 611, 2-bit reserved field ("00") 612, 8-bit key code 613, and 4-bit cyclic redundancy check (CRC) field 614. In the above and in the following, the same reference numerals are used to label substantially identical fields in polling command packet 600 and polling response packets 610, 620 and 630. For simplicity, the description of these common fields are not repeated. 8-bit key code 613 encodes a key depressed on the keyboard. Hence, polling response packet 610 includes 20 bits of data, encoded by 10 symbols.

In this embodiment, the next time the XIR host polls the same XIR peripheral, the XIR host inverts toggle bit 603 to indicate that a polling response was correctly received. However, if the XIR host did not receive a uncorrupt response, the toggle bit remains the same to indicate to the XIR peripheral that the previous response, if any, should be retransmitted. To conserve power, an XIR peripheral need not respond to any polling command, unless new data is available to be sent. However, if the XIR peripheral chooses to respond, it must respond within pre-determined time limit, so that, when this time limit expires, the XIR Host may start to poll other XIR peripherals or let other XIR Hosts to poll their XIR peripherals.

Figure 6C:
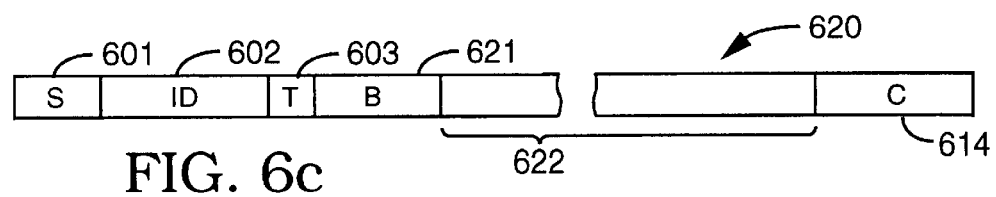
FIG. 6c shows format 620 of a polling response packet from a pointing device.

FIG. 6c shows format 620 of a polling response packet from a pointing device. As shown in FIG. 6c, polling response packet 620 includes 2-bit start header 601, ID field 602, toggle bit 603, 3-bit button closures field 621, 16-bit coordinate update field 622 and CRC field 614. In this embodiment, button closures field 621 encodes the open or close state of each of three buttons on the pointing device. Coordinate update field 622 encodes variations in the x-direction (6 bits), y-direction (6 bits) and z-direction (4 bits). Thus, polling response packet 620 is encoded in 30 bits or 15 symbols.

Figure 6D:
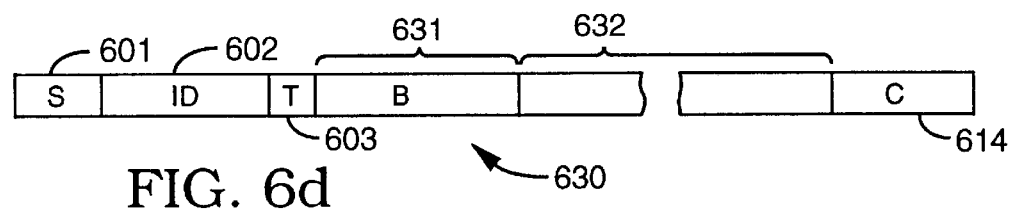
FIG. 6d shows format 630 of a polling response packet from a game pad.

FIG. 6d shows format 630 of a polling response packet from a game pad. As shown in FIG. 6d, polling response packet 630 includes 2-bit start header, 4-bit ID field 602, toggle bit 603, 7-bit button closures field 631, 20-bit coordinate update field 632 and 4-bit CRC field 614. Polling response packet 630 differs from polling response packet 620 only on the number of bits used to represent button closures and coordinate update. In polling response packet 630, up to 8 buttons can be encoded in button closures field 631, and 8 bits are provided for each of the x- and y-directions, and 6 bits are provided for the z-direction. Thus, polling response packet 630 uses 38 bits or 19 symbols.

In this embodiment, 4-bit CRC field 614, which is used for error checking, is computed using the polynomial $X^0+X^1+X^4$. The following illustrates one method for computing such CRC value:

1. Initialize the variable crc to 0xF.
2. Update crc for each nibble of data to be transmitted (see below).
3. Encode crc in the same manner as encoding data, least significant 2-bit first, most significant 2-bit last.

The above method for computing CRC can be implemented in the following code segment using the programming language "C". In this example, data type int can be implemented by one byte (i.e., 8 bits), but only the least significant nibble (4 bits) is actually used.

```
static int crc;
void init_crc (void) {
   crc=0xF;
}
void update_crc (int nibble_of_data) {
   const static int crc_table[16]={
      0x0,0x7,0xE,0x9,0x5,0x2,0xB,0xC,
      0xA,0xD,0x4,0x3,0xF,0x8,0x1,0x6
      }
   crc=crc_table[(nibble_of_data ^ crc) & 0xF];
}
```

When there is only one active XIR Host in a room, the XIR Host has sole control of all XIR peripheral present. Since the XIR peripherals respond only after it is polled, no contention in the XIR media is possible with only one XIR host. When two XIR hosts are present, to avoid contention, an arrangement to share the communication channel is necessary. For example, after one XIR host completed polling an XIR peripheral, the XIR host must yield the communication channel to the other XIR host, unless, the XIR host does not send out a polling command packet within a predetermined and agreed upon time limit. More sophisticated arbitration or multiplexing protocols can be used for systems having three or more XIR hosts.

In this embodiment, the number of XIR hosts are manually set up. However, automatically and dynamically setting of XIR hosts can be provided using special commands and responses packets identified by an ID field value of 0x0 or 0xF.

The above detailed description is provided to illustrate the specific embodiments and is not intended to be limiting. Numerous variations and modifications within the scope of the present invention are possible. The present invention is set forth by the accompanying claims below.

We claim:

1. A method for encoding a bit stream into symbols for transmitting over a wireless communication link, comprising:

providing a state machine having a first state, a second state and a third state, wherein said first state, said second state and said third state are associated with a first group of symbols, a second group of symbols and a third group of symbols, respectively, wherein selected symbols from said first group of symbols, said second group of symbols and said third group of symbols are designated state transition symbols;

initializing said state machine to said first state;

until all bits in said bit stream are encoded, repeating the steps of:

(a) removing from said bit stream a predetermined number of bits;

(b) when said state machine is in said first state, encoding said bits removed from said bit stream into a symbol selected from said first group of symbols according to a predetermined map, and entering said second state when said selected symbol is one of said designated state transition symbols;

(c) when said state machine is in said second state, encoding said bits removed from said bit stream into a symbol selected from said second group of symbols according to said predetermined map, and when said selected symbol is one of said designated state transition symbols, entering said third state when said selected symbol has a ratio of first logic value bits to second logic value bits that is less than a predetermined value; and (d) when said state machine is in said third state, encoding said bits removed from said bit stream into a symbol selected from said third group of symbols according to said predetermined map, and when said selected symbol is one of said designated state transition symbols, entering said second state.

2. A method as in claim 1, wherein each symbol in said first group of symbols has a ratio of first logic value bits to second logic value bits equal to said predetermined value, and each symbol in said third group of symbols has a ratio of first logic value bits to second logic value bits greater than said predetermined value.

3. A method as in claim 1, wherein no symbol in said first group of symbols, said second group of symbols and said third group of symbols has consecutive first logic value bits.

4. A method as in claim 1, wherein a designated state transition symbol in said first group of symbols and another symbol in said first group of symbols, when concatenated, form a bit sequence that has two first logic value bits separated by less than a predetermined number of second logic value bits.

5. A method as in claim 1, wherein a designated state transition symbol in said second group of symbols and a symbol in said third group of symbols, when concatenated, form a bit sequence that has a ratio of first logic value bits to second logic value bits equal to said predetermined value.

6. A method as in claim 1, wherein said predetermined value is 25%.

7. A method as in claim 1, wherein said first group of symbols, said second group of symbols, and said third group of symbols form a code dictionary with a run length limit of (1, 6).

8. A method as in claim 7, wherein said code dictionary includes error correction capability to extend said run length limit.

9. A method as in claim 1 further comprising providing a decoder, said decoder, upon receiving a symbol not in said first group of symbols, said second group of symbols and said third group of symbols, provides an output value corresponding to decoding a symbol having a Hamming distance less than a said predetermined value.

10. A wireless communication system comprising:
- a controller capable of sending a polling packet having an identification field; and
- a plurality of devices each assigned a different identification value, capable of sending a response packet in response to said polling packet when a value in said identification field matches said identification value;
- wherein said controller and each of said devices comprise a transmitter capable of encoding a bit stream according to said method of claim 1.

11. A wireless communication system as in claim 10, wherein said method is used in conjunction with a sub-carrier frequency.

12. A wireless communication system as in claim 11, wherein said sub-carrier frequency is 56 KHz.

13. A wireless communication system as in claims 10, wherein each transmitter receives data in a parallel format and transmits data serially.

14. A wireless communication system as in claim 13, said transmitter further comprising a clock generator circuit.

* * * * *